United States Patent [19]
Worley et al.

[11] Patent Number: 5,654,862
[45] Date of Patent: Aug. 5, 1997

[54] METHOD AND APPARATUS FOR COUPLING MULTIPLE INDEPENDENT ON-CHIP $V_{DD}$ BUSSES TO AN ESD CORE CLAMP

[75] Inventors: Eugene R. Worley, Ivine; Chilan T. Nguyen, Fullerton; Raymond A. Kjar, Costa Mesa; Mark R. Tennyson, Irvine, all of Calif.

[73] Assignee: Rockwell International Corporation, Newport Beach, Calif.

[21] Appl. No.: 732,752

[22] Filed: Oct. 18, 1996

Related U.S. Application Data

[63] Continuation of Ser. No. 427,017, Apr. 24, 1995, abandoned.
[51] Int. Cl.⁶ ..................................................... H02H 9/04
[52] U.S. Cl. ............................... 361/111; 361/91; 361/56
[58] Field of Search ................................... 361/56, 111, 58, 361/91

[56] References Cited

U.S. PATENT DOCUMENTS

| | | | |
|---|---|---|---|
| 4,698,720 | 10/1987 | Finaurini | 361/91 |
| 4,736,271 | 4/1988 | Mack et al. | 361/91 |
| 5,034,845 | 7/1991 | Murakami | 361/56 |

*Primary Examiner*—Todd Deboer
*Attorney, Agent, or Firm*—William C. Cray; Philip K. Yu

[57] ABSTRACT

A single clamp circuit for integrated circuits with multiple $V_{dd}$ power pins by coupling the various $V_{dd}$ busses to an ESD clamped $V_{dd}$ bus or pseudo- $V_{dd}$ bus via diodes. The diodes will provide coupling from any $V_{dd}$ bus to the clamp circuit during a positive ESD transient. A diode for each $V_{dd}$ bus and a single clamp circuit can be much more area efficient than a single clamp circuit for each $V_{dd}$ bus. During normal operation, the diodes will become weakly forward biased due to the leakage current of the clamp circuit. Small signal noise will tend not to be coupled from one bus to the other because of the high impedance of the diodes. For a large positive noise transient on one bus, the other bus diode will reverse bias, thus decoupling the signal from the other busses. A large negative noise transient on one bus will cause its diode to reverse bias thus decoupling it from the other busses. To help filter small signal noise and provide an additional charged device model discharge path, a capacitor is added from the pseudo or ESD $V_{dd}$ to substrate ground. Also disclosed is an ESD protection scheme for allowing a pad voltage to exceed the power supply voltage without using an avalanching junction as the ESD protection means. Further disclosed is a clamp scheme for allowing the transistors of the power supply clamp to see voltages lower than that of the pad voltage which exceed the process reliability limits.

20 Claims, 5 Drawing Sheets

METHOD AND APPARATUS FOR COUPLING MULTIPLE INDEPENDENT ON-CHIP $V_{DD}$ BUSSES TO AN ESD CORE CLAMP

This is a continuation application of application Ser. No. 08/427,017, filed on Apr. 24, 1995 now abandoned.

RELATED APPLICATION

The present application relates to a U.S. Patent Application, filed on Jul. 26, 1994, with Ser. No. 280,417, now U.S. Pat. No. 5,440,162, issued on Aug. 8, 1995, entitled ESD PROTECTION SUBMICRON CMOS CIRCUITS by Eugene R. Worley et. al., a co-inventor of the present application, and assigned to the present assignee. The disclosure of the Related Application is hereby incorporated by reference.

1. Field of the Invention

The present invention relates to electrostatic discharge ("ESD") protection circuits for integrated circuits ("IC") and more particularly to ESD devices for IC's for mixed signal applications.

2. Art Background

Recent progress in VLSI technology has made IC's with smaller and smaller geometry's a reality. As the devices become more miniaturized, however, they also become more susceptible to electrostatic discharge (ESD) damage. If not properly diffused, ESD can destroy a device, lower reliability and eventually reflect in the bottom line of an electronic device manufacturer.

Protecting a device from the consequences of ESD has been quite an endeavor for those skilled in the art. Integrated circuits nowadays are fabricated with many layers of thin film materials such as thermal oxides, dielectric layers, polycrystalline silicon and metal films. The addition of each layer complicates the ESD problem.

To minimize the effect of ESD on integrated circuits, protection devices have been constructed for the input and output pads of a device for the purpose of absorbing the sudden surge of ESD. Conventional ESD protection structures, however, are effective primarily in devices with a single $V_{dd}$ power supply for digital signals.

For IC's with mixed signals, i.e. digital and analog signals, multiple independent $V_{dd}$ power supply busses are required to accommodate the requirement of isolation between the various circuit functions. To provide adequate ESD protection, it is necessary to use a core clamp circuit to provide a robust discharge path from a pad, through a P⁺/well diode, and through the clamp from each $V_{dd}$ to substrate ground for positive ESD surges, Unfortunately, the clamp circuit requires a significant amount of area given that a cumulative minimum NFET ("n-channel field-effect transistor") width of 6400µ is generally required to be connected from $V_{dd}$ to substrate for each bus clamp. For chips with several $V_{dd}$ busses, the area becomes prohibitively large when clamps are provided for each $V_{dd}$ bus.

SUMMARY OF THE INVENTION

Therefore, it is an object of the present invention to provide ESD protection to IC's with multiple $V_{dd}$ power supplies.

It is another object of the present invention to provide ESD protection to IC's with multiple $V_{dd}$ power supplies for mixed signals applications.

It is further an object of the present invention to provide ESD protection to IC's with multiple $V_{dd}$ power supplies for mixed signals applications while maximizing silicon area efficiency.

It is also another object of the present invention to provide ESD protection to IC's having pad voltage capable of exceeding the supply voltage and/or the process limit of transistors.

It is therefore proposed that a single clamp circuit be used for IC's with multiple $V_{dd}$ clamps by coupling the various $V_{dd}$ busses to an ESD clamped $V_{dd}$ bus or pseudo- $V_{dd}$ bus via diodes. The diodes will provide coupling from any $V_{dd}$ bus to the clamp circuit during a positive ESD transient. A diode for each $V_{dd}$ bus and a single clamp circuit ("BIGFET" as referred to in the aforementioned related U.S. Patent Application) can be much more area efficient than a single BIGFET clamp circuit for each $V_{dd}$ bus.

During normal operation, the diodes will become weakly forward biased due to the leakage current of the clamp circuit. Small signal noise will tend not to be coupled from one bus to the other because of the high impedance of the diodes. For a large positive noise transient on one bus, the other bus diode will reverse bias, thus decoupling the signal from the other busses. A large negative noise transient on one bus will cause its diode to reverse bias thus decoupling it from the other busses. To help filter small signal noise and provide an additional charged device model ("CDM") discharge path, a capacitor is added from the pseudo or ESD $V_{dd}$ to substrate ground.

BRIEF DESCRIPTION OF THE DRAWINGS

Additional objects, features and advantages of the present invention will become apparent to those skilled in the art from the following description, wherein.

DETAILED DESCRIPTION OF THE DRAWINGS

1. ESD PROTECTION NETWORK FOR INTEGRATED CIRCUITS WITH MULTIPLE SUPPLIES

Figure 1:
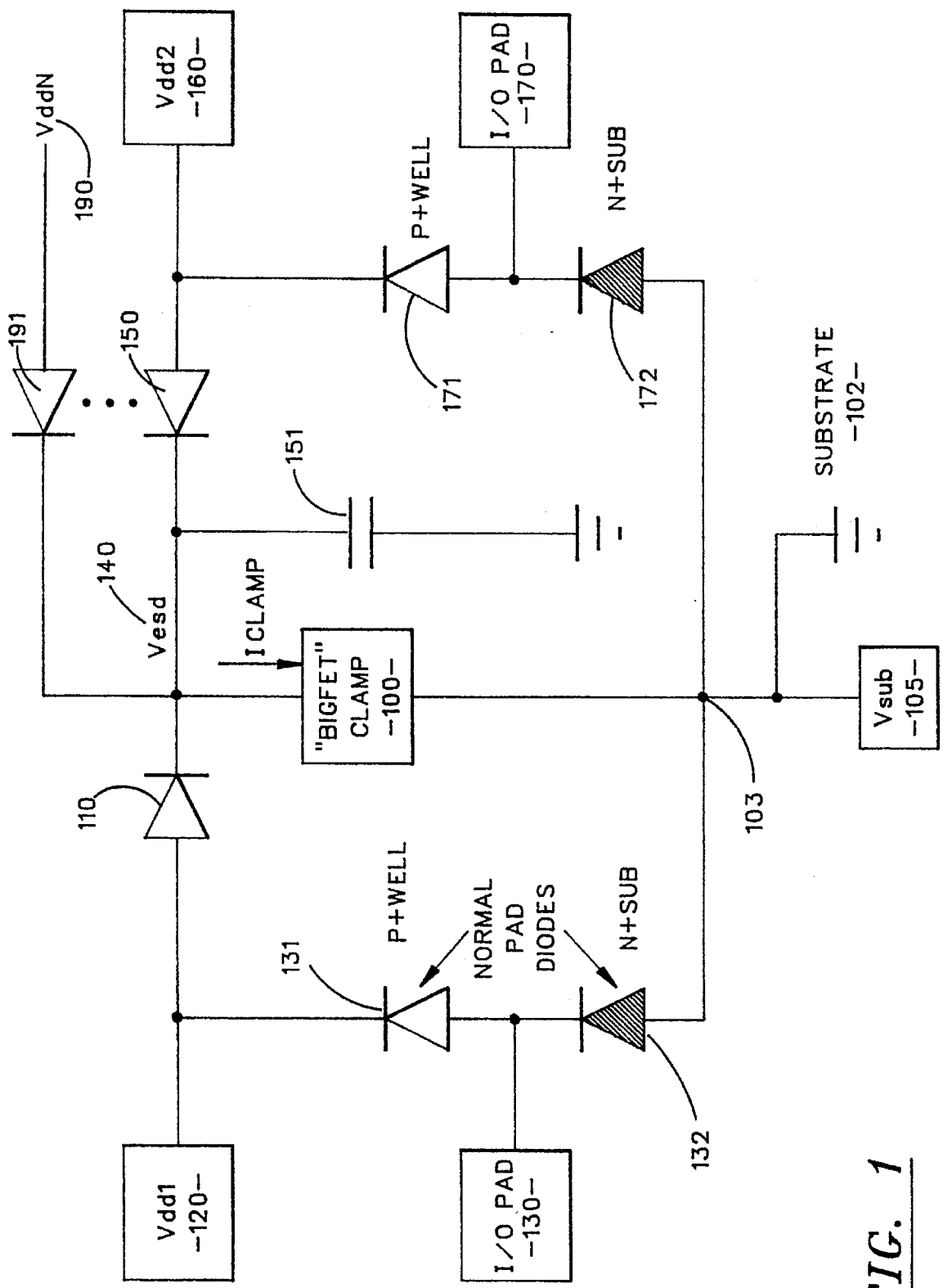
FIG. 1 shows a simplified circuit diagram of a multiple supply bus protection circuit with a shared transient clamp in accordance with the present invention.

FIG. 1 shows a basic circuit diagram of a multiple power supply ESD protection in accordance with the present invention. For multiple supplies, i.e. $V_{dd}1$ 120, $V_{dd}2$ 160 to $V_{dd}N$ 190, a transient clamp ("BIGFET" Clamp) 100 is used for providing a transient current path. The common connection among the various supplies is a "bus", i.e. $V_{esd}$140, which is, connected to each supply through a coupling diode, 110, 150, 191. Note that diodes 131, 171 are normal P⁺/well pad diodes and diodes 132, 172 are normal N⁺/substrate pad diodes coupled to the I/O pads 130, 170, as will be appreciated by those skilled in the art. An I/O pad, as will be appreciated by those skilled in the art, may be an input-only pad, an output-only pad or an input/output pad. Note that a current path is created for transient currents from any I/O pad to $V_{dd}$ pad 120, 160 or 190, through its coupling diode, 110, 150 or 191, $V_{esd}$ bus 140 and the "BIGFET" clamp 100, to the substrate ground 102.

Figure 2:
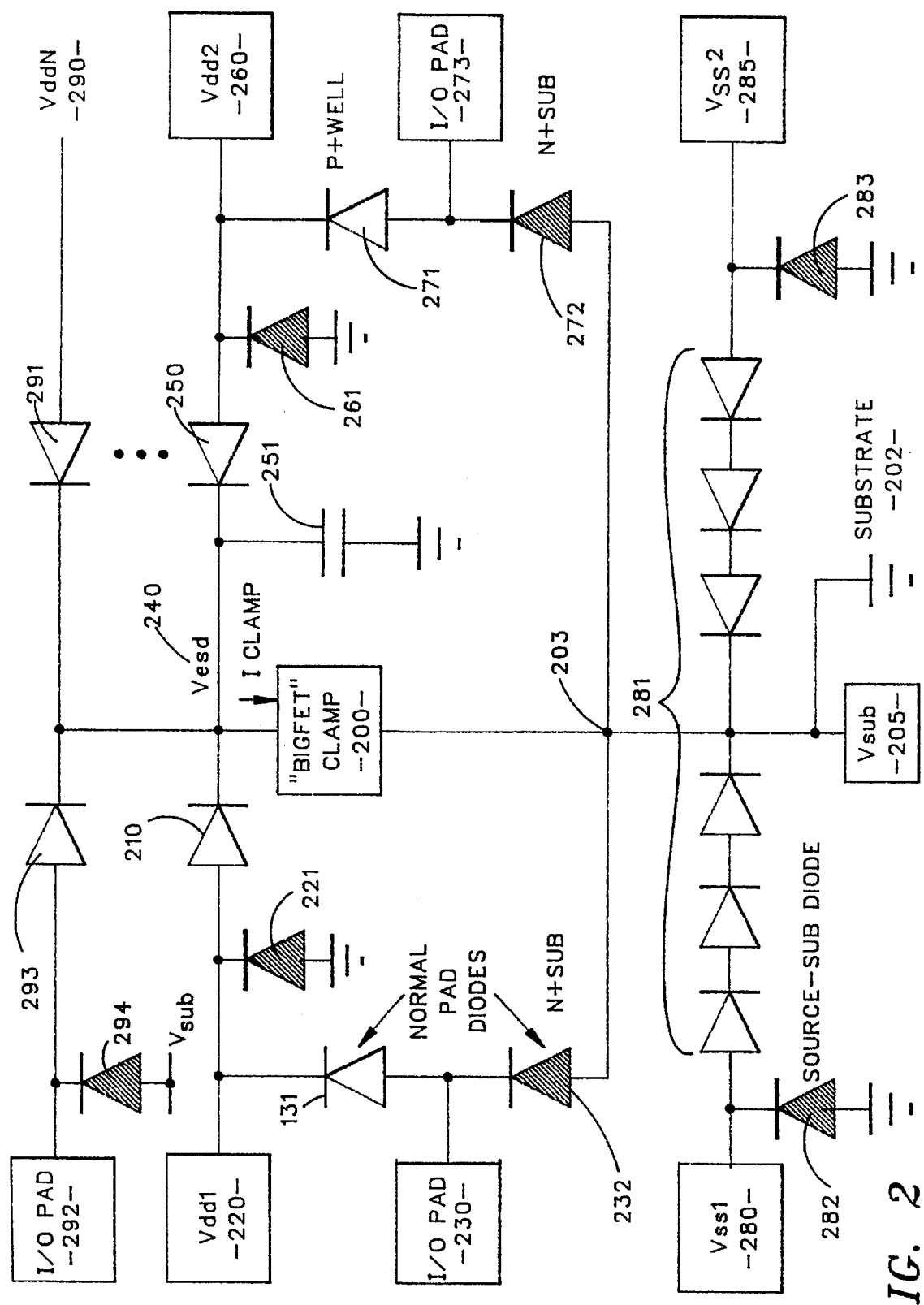
FIG. 2 shows another circuit diagram of a multiple supply bus protection network with a shared transient clamp in accordance with the present invention.

FIG. 2 shows another embodiment of a multiple power supply protection network with a single shared "BIGFET" clamp 200 in accordance with the present invention. It should be noted that the "BIGFET" clamp is a transient clamp, which may be constructed in accordance with the aforementioned Related U.S. Patent Application. Note that the function of a transient clamp is to turn on only when the voltage changes very rapidly. However, those skilled in the art could readily construct their own transient clamps based on their respective applications and processes to take advantage of the teachings of the present invention. One other possible implementation of a transient clamp may be found in a publication entitled "ESD Design Methodology", p. 233, ELECTRICAL/OVERSTRESS ELECTROSTATIC DISCHARGE SYMPOSIUM, 1993.

Figure 3:
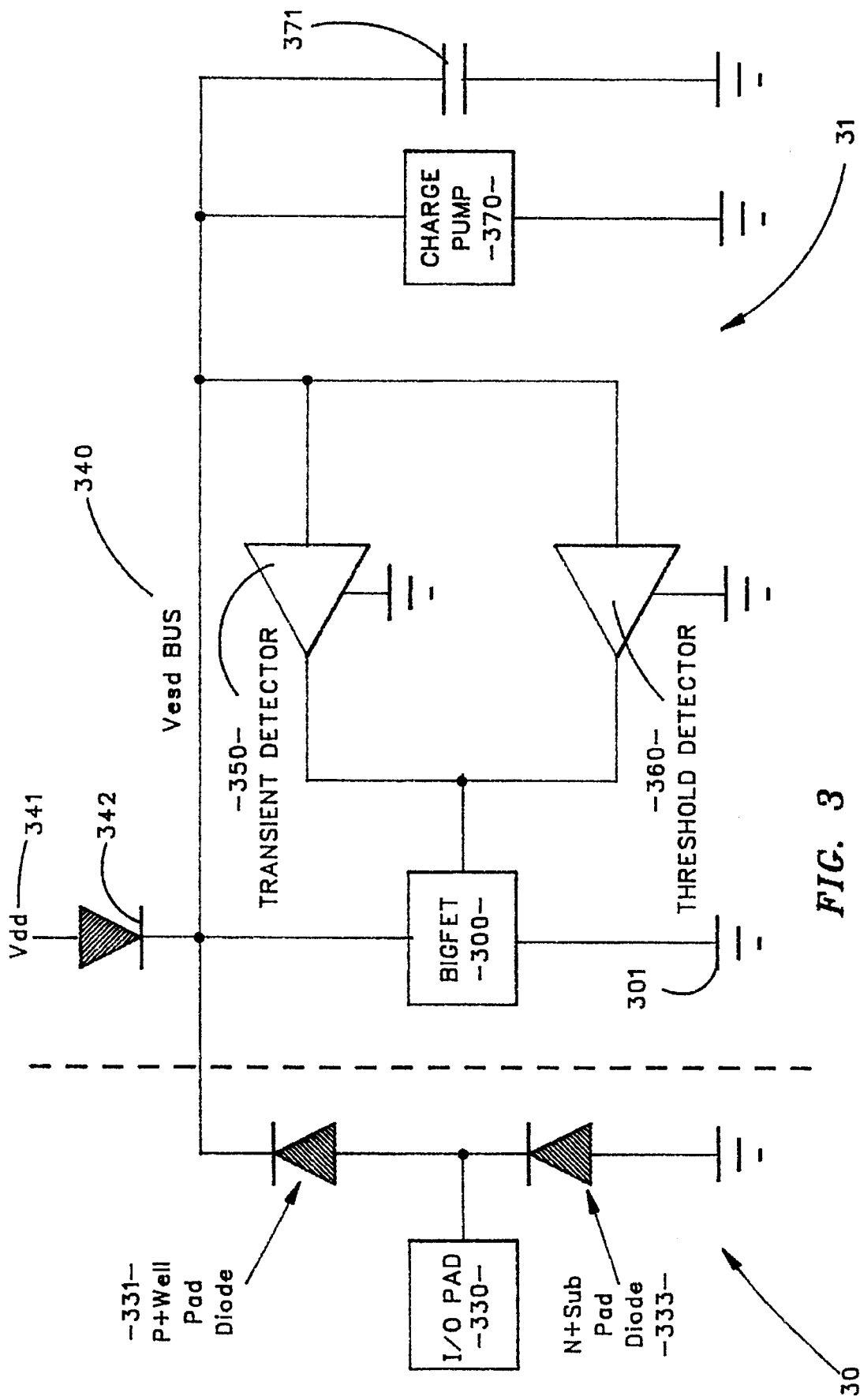
FIG. 3 shows a generalized diagram of the "BIGFET" transient clamp for applications where the I/O pad voltage exceeds the supply voltage.

While the transient clamp, i.e. the "BIGFET" clamp, has been, and will be, described as being constructed and implemented with MOSFET devices, as shown in FIG. 3, 300, it should be appreciated by those skilled in the art that it may also be implemented with bipolar devices such that the transient clamp may be applied to bipolar circuits.

It should be noted that the substrate 202 is separate from the various $V_{ss}$ supply pads 280, 285. The $V_{dd}$'s 220, 260, 290 to common clamp coupling is achieved using P+/well diodes 210, 250, 291, respectively. Note that this arrangement does not put any restrictions on power supply sequencing or the magnitude of the power supply voltages appearing at the $V_{dd}$'s. $V_{esd}$ 240 will reach a voltage equal to one diode drop below the highest power supply value. The clamp 200 is intended to provide a transient current path from $V_{esd}$ 240 to substrate ground 202.

Other circuit elements include diodes 221, 261, which represent the well-to-substrate diodes collectively associated with the inherent PFET wells of the core circuit to be protected, diodes 282, 283, which represent the N+ to substrate diodes collectively associated with the inherent sources of core circuit NFETs, and diodes 232, 231, 272, 271, which are the typical pad diodes as will be recognized by those skilled in the art. Note that directional current loops are formed such as the one associated with diodes 272, 271, 250, and the clamp 200. Diodes 281 are $V_{ss}$-to-substrate coupling diodes which may be required for positive discharges into the $V_{ss}$ pads 280, 285. These diodes are made using P+/well diodes. In the case shown here 3 serial diode group 281 are used to produce an isolation voltage of about 1.5 V between $V_{ss}$ 280 and $V_{sub}$ 205. Note that the connection between the local substrate of the N+/substrate diode (232, 272) and the "BIGFET" clamp (200) is made by a direct metal connection rather than through the substrate. If bulk or deep implanted wafers are used this connection may become absolutely necessary. A capacitor 251 is used to attenuate high speed, low energy pulses associated with machine discharges and has an intrinsic time constant no greater than 100 ps.

It can be seen in FIG. 2 that there exists a robust current path from any pad, I/O Pad or $V_{dd}$ Pad, to any other pad or to the substrate 202. Thus, this configuration handles any polarity of discharge to any pin or between any pins of the device.

The I/O pad 292 associated with diodes 293, 294 may be a pad whose input voltage can rise above any $V_{dd}$. In this case, $V_{esd}$ 240 is set by the maximum voltage on this pad minus a diode drop produced by the diode 293. Note that the pad source should provide at least some of charging current for the capacitance of $V_{esd}$ 240. It is possible to put a charge pump voltage source on $V_{esd}$ 240 if this arrangement is not satisfactory as will be appreciated by those skilled in the art. The charge pump needs to be only large enough to supply the leakage current associated with the clamp 200 circuit (several µA worst case). The charge pump will be described in the following section.

Those skilled in the art will also recognize that ESD discharges can be viewed as current sources whose peak currents are on the order of Amps. Discharge times typically range from less than 1 ns for a machine-type discharge to over 100 ns for a human-type discharge. Because of the large currents, big diodes and wide metal lines are required. The size of the shunt devices are such that voltage drops produced by the large ESD discharge current do not cause junctions or transistors to avalanche breakdown. For a typical sub-micron process, this is about 12 v for an NFET. Breakdown of a silicided junction almost invariably produces leakage. Fortunately, diodes operated in the forward direction are extremely robust. For designs where isolation is critical, it may be necessary to simulate the feed through effects of the capacitance of the coupling diodes.

ESD PROTECTION PADS WITH MAXIMUM VOLTAGE EXCEEDING POWER SUPPLY

Reference is now to FIG. 3, where a generalized ESD clamp with I/O pads is shown. To the left of the dotted line is the pad element 30 of the ESD protection network, while the other side is the clamp circuit element 31. FIG. 3 shows a generalized diagram of a "BIGFET" power supply clamp used for applications in which the I/O pad 330 voltage can exceed $V_{dd}$ 341. For this case, $V_{dd}$ 341 charges a dedicated bus, $V_{esd}$ 340, to $V_{dd}$ minus a diode drop via a diode 342. Without the charge pump 370 as shown, an external circuit driving the I/O pad 330 may need to charge the $V_{esd}$ bus 340 from this voltage of $(V_{dd}-V_{diode})$ to a voltage of $V_{I/O}(Max)$ minus a diode drop via a diode 331. Once charged, only a small leakage current will flow (a few uA worst case). If it is desired that the external circuit driving the I/O pad 330 not have to charge the $V_{esd}$ bus 340 to $(V_{in}(Max)-V_{diode})$ or sustain the bus 340 at this voltage because of leakage currents, then a small charge pump 370 can be added to both charge up $V_{esd}$ 340 to this voltage and sustain the voltage.

The BIGFET clamp 300 offers a low impedance path from $V_{esd}$ 340 to ground 301 when enabled by either one of two detectors 350, 360. Otherwise, the BIGFET clamp 300 is off and offers a high impedance path between the $V_{esd}$ node 340 and the ground node 301. The transient detector 350 turns the BIGFET clamp 300 "on" momentarily if the voltage is changing rapidly due to an ESD discharge into the $V_{esd}$ node 340 via the I/O pad 330 and diode 331. Typically, this transient detector 350 may be realized using an RC rate detector and possibly an inverter which drives BIGFET's gate. When "on," BIGFET clamp 300 must shunt a current on the order of Amps to ground so that voltage drops within the chip do not exceed junction breakdown voltages.

The threshold detector 360 may be optional and is used to limit the voltage on the $V_{esd}$ bus 340. Transients can appear at the I/O pad 330 such as waveform overshoot due to transmission line effects. This over voltage can appear on the $V_{esd}$ bus 340. Note that the assumption is that the transistors associated with the BIGFET clamp 300 can reliably tolerate the normal maximum pad voltage minus a diode drop but cannot reliably tolerate a large transient overshoot or spike on the I/O pad 330 which leaves $V_{esd}$ 340 at a much higher level. Thus, as a predetermined voltage or threshold is crossed on $V_{esd}$ 340 due to a transient spike on the I/O pad 330, the threshold detector 360 turns the BIGFET clamp 300 "on", which in turn holds the voltage on the $V_{esd}$ bus 340 at the threshold value. One of the added advantages of this detector 360 is to reduce signal reflections at the I/O pad 330 because of the attenuating effect of turning on the BIGFET clamp 300 during a signal overshoot condition.

A capacitor 371 may be implemented to help attenuate a CDM ("Charge Device Model") ESD transient (as described in the aforementioned Related Patent Application). Because of the fast rise time of a CDM discharge the time constant of this capacitor and it associated parasitic resistance should be less than 100 ps.

ESD PROTECTION CIRCUIT WHERE MAXIMUM PAD VOLTAGE EXCEEDS PROCESS MAXIMUM VOLTAGE

Figure 4:
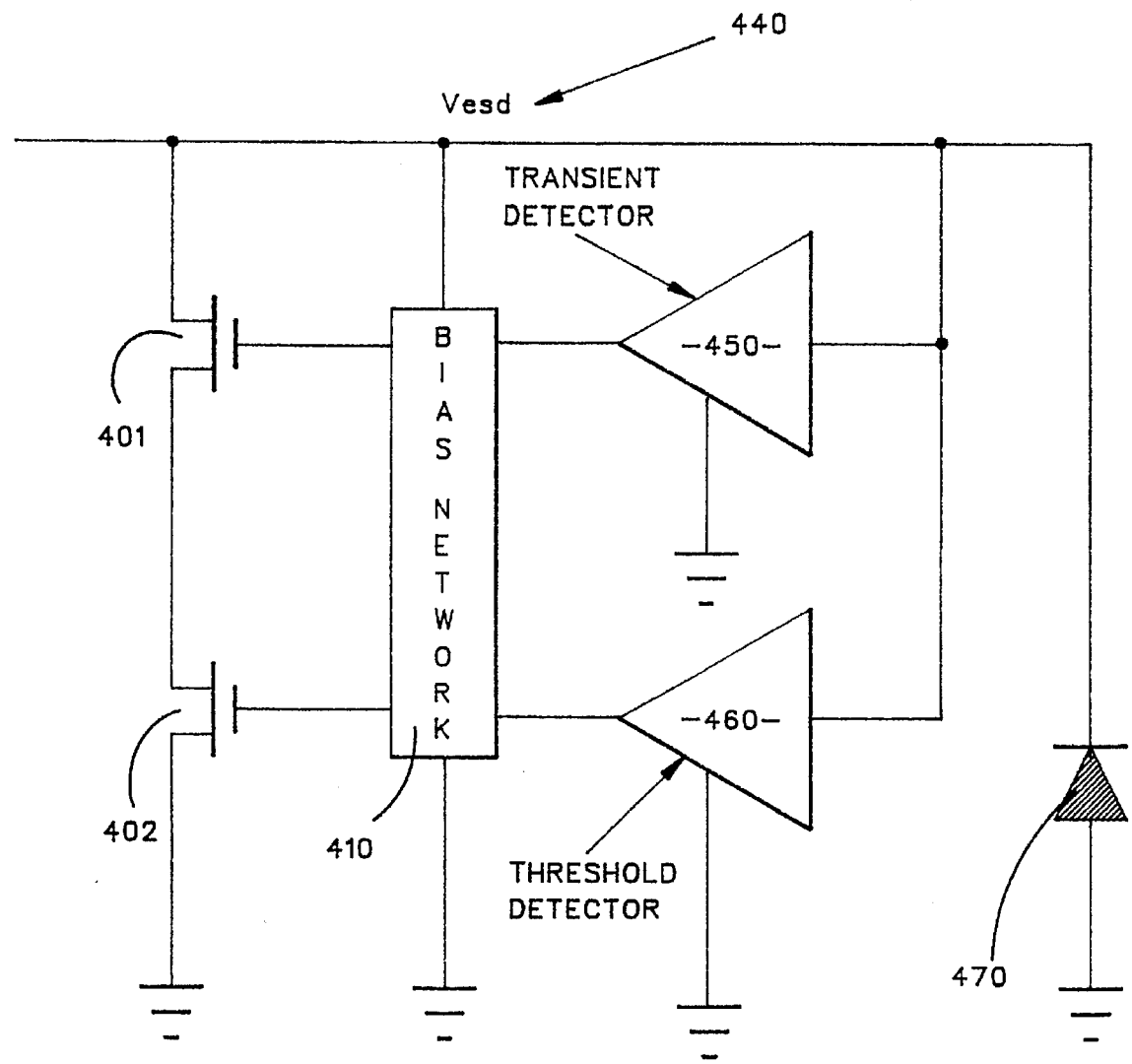
FIG. 4 shows a generalized diagram of the transient clamp for applications where the $V_{esd}$ bus voltage exceeds the process limit voltage.

Reference is to FIG. 4, where it is shown generalized $V_{esd}$ bus clamp devices 401, 402, for applications in which the normal $V_{esd}$ bus 440 voltage exceeds the process voltage limit imposed on a transistor's gate oxide. For example, there are processes which allow a maximum voltage of 3.6 v to appear across a gate oxide but a chip requirement may mandate that it interfaces to 5 v signals. For this case, a BIGFET clamp as previously described may be realized using two large series MOSFETs 401, 402. The bias network 410 may be designed so that during normal chip operation no voltage greater than 3.6 v, or whatever the process limit is, appears across any oxide even though a 5.5 v amplitude signal (maximum for a 5 v system) can appear across an I/O pad (not shown). Thus, the bias network 410 partitions voltages to the two large MOSFET's 401, 402, meeting the process reliability limits while keeping them in the "off" state. A possible implementation of the bias network will be described in FIG. 5 below.

As in the previous case, a transient detector 450 and a threshold detector 460 may be used to turn on MOSFET's 401, 402. A diode 470 is a large "robust diode" as described in the aforementioned Related Patent Application and may be used as a CDM attenuation capacitor. A gate oxide capacitor cannot be used since it is assumed that the voltage on $V_{esd}$ 440 exceeds the reliability limit of the gate oxide.

4. ANOTHER PREFERRED EMBODIMENT

Figure 5:
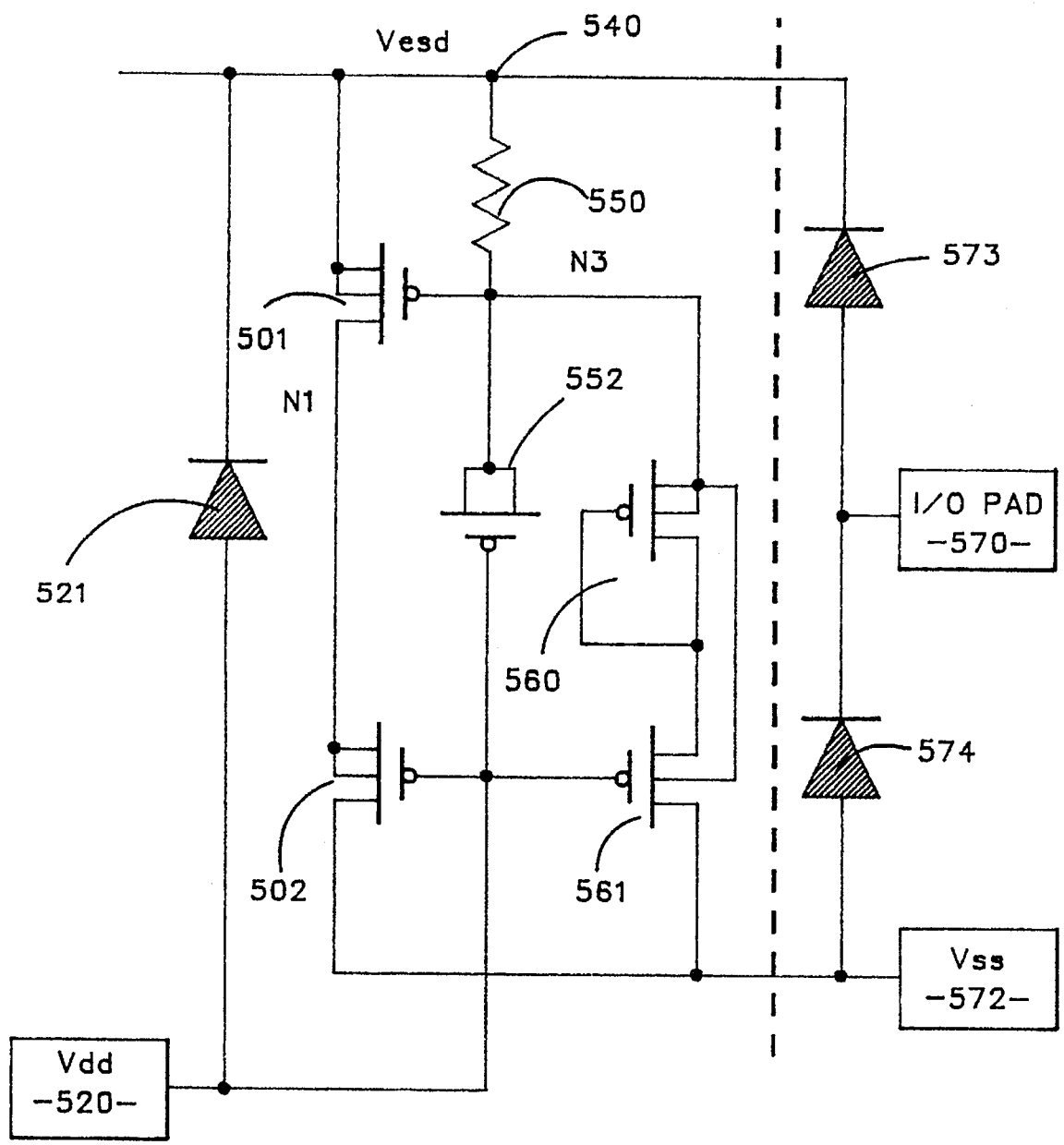
FIG. 5 shows another preferred embodiment of the protection circuit in accordance with the present invention.

Reference is to FIG. 5, where another embodiment of the $V_{esd}$ bus clamp circuit is shown. The two series transistors, 501 and 502, function as the "BIGFET" clamp and are connected between $V_{esd}$ 540 and $V_{ss}$ 572 or ground. A diode 521 is used to charge $V_{esd}$ 540 to a voltage level of $(V_{dd}-V_{diode})$. A resistor 550 and PFET 552 function as the transient detector and PFET's 560 and 561 function as the threshold detector. During normal operation, the gate of PFET 502 is set to $V_{dd}$ and the gate of PFET 501 is set to $V_{esd}$. For the sake of illustration assume that $V_{dd}$ is 3.3 V and that $V_{esd}$ is set to 5.0 v by a pad signal. Also assume that the PFET threshold voltage $(V_{tp})$ is $-1.0V$. The quiescent voltages on the PFET 501 drain (node 1), gate (node 3), source $(V_{esd})$, and body (well) are $(V_{dd}-V_{tp})$ or 4.3 V, 5 v, 5 v, and 5 v, respectively. For PFET 502, the drain, gate, source, and body voltages are 0 v, 3.3 v, 4.3 v $(V_{dd}-V_{tp})$, and 5 v, respectively. Thus, for PFET 501 the gate to drain, gate to source, and the gate to body voltages are 0.7 v, 0 v, and 0 v, respectively. For PFET 502, they are 3.3 v, 1.0 v and 1.0 v. Both transistors are in a non-conducting state, and only leakage currents flow from $V_{esd}$ to $V_{ss}$. Note that no voltage greater the 3.6 v (the maximum allowed for the process) appears across the gate oxide of either of the clamp MOS PFETs 501, 502.

The circuit of FIG. 5 protects against an ESD discharge as follows. Assuming that the chip is unpowered, a fast positive transient coupled to $V_{esd}$ 540 will not cause $V_{dd}$ to rise much above $V_{ss}$ due to the large circuit capacitance between $V_{dd}$ and $V_{ss}$. The MOSFET 552, which is used as a capacitor, will momentarily keep PFET 501's gate potential at that of $V_{dd}$. Thus, both PFET's 501 and 502 will be in the "ON" state since both of their gate potentials are near $V_{ss}$ 572, while their sources are being pulled up by $V_{esd}$ 540. The time and the degree to which PFET's 501 and 502 are "ON" may be determined by the RC time constant of resistor 550 and PFET 552 capacitance.

Threshold clamping is determined by PFET's 560 and 561. PFET 501 begins to turn ON once $V_{esd}$ 540 is greater than $V_{dd}$ by three Vtp drops or, for the example above, about 6.3 v. Once PFET 501 turns "ON" it will pull the source voltage of PFET 502 toward $V_{esd}$ 540 thus turning on PFET 502. PFET's 501 and 502 will therefore offer a strong conducting path between $V_{esd}$ 540 and Vss 572 if $V_{esd}$ 540 rises much above 6.3 v thereby clamping $V_{esd}$ 540.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clause are intended to cover the structures described herein as performing the recited function and not only structural equivalents but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

We claim:

1. An ESD protection network for IC with a plurality of power supplies, comprising:

a plurality of power supply pads, receiving said plurality of said power supplies for said IC;

a transient clamp, said transient clamp generating a low impedance path to ground an ESD transient;

a bus with a plurality of terminals, at least one of its terminals being connected to said transient clamp;

a plurality of diodes, each of said diodes being formed in-between one of said plurality of power supply pads to another one terminal of said bus, to provide a forward-biased path from each of said power supply pads to said transient clamp through each of said diodes and said bus, at least one of said plurality of diodes becoming reverse-biased to clamp an ESD transient.

2. A network according to claim 1, wherein said transient clamp comprises:

at least one transistor, said one transistor having low impedance when switched on;

a transient detector coupled to said at least one transistor, said transient detector switching said at least one transistor on when a rapid voltage increase beyond a predetermined level occurs across it on said bus.

3. A network according to claim 2, wherein said at least one transistor is serially connected to said bus.

4. A network according to claim 2, wherein said transient detector is an RC network with a predetermined time constant.

5. A network according to claim 2, further comprising a charge pump coupled to said bus, said charge pump maintaining said bus to a predetermined voltage equal to the highest voltage on one of said plurality of pads.

6. A network according to claim 2, wherein said plurality of diodes are P+/well diodes.

7. A network according to claim 2, wherein said transient clamp is constructed with bipolar devices.

8. A network according to claim 2, wherein said transient clamp is constructed with MOSFET devices.

9. In an integrated circuit ("IC") with a predetermined substrate, said IC being coupled to at least one power supply having a predetermined voltage level and said IC having at least one input pad receiving an input, an ESD protection network comprising:

a transient clamp coupled to said substrate, said transient clamp providing a low impedance path to said substrate when said voltage level of said input exceeds said predetermined voltage level of said power supply;

a bus with a plurality of terminals, at least one of said plurality of terminals being connected to said transient clamp;

at least one diode, formed in-between said at least one power supply and said bus, to provide a forward-biased path from said power supply to said transient clamp through said diode and said bus, said at least one diode becoming reverse-biased to clamp an ESD transient, such that said IC allows said at least one input to operate above said at least one power supply with said predetermined voltage.

10. An ESD protection network according to claim 9, wherein said at least one diode comprises a P+/well diode.

11. A network according to claim 9, wherein said transient clamp is constructed with bipolar devices.

12. A network according to claim 9, wherein said transient clamp is constructed with MOSFET devices.

13. In an integrated circuit ("IC") with a predetermined substrate, said IC being coupled to at least one power supply having a predetermined voltage level and said IC comprising at least one input pad receiving an input, said input having an input voltage, an ESD protection network comprising:

a transient clamp coupled to said predetermined substrate, said transient clamp generating a low impedance path to said substrate when said input voltage exceeds a predetermined maximum process voltage, said transient clamp comprising two serially connected transistors;

a bus having a first end coupled to said transient clamp, said bus being electrically isolated from said at least one power supplies;

at least one diode being formed in-between said at least one power supply and said transient clamp, to provide a forward-biased path from said at least one power supply to said transient clamp through said at least one diode and said bus, said at least one diode becoming reverse-biased to prevent a transient from said IC;

a bias network coupled to said serially connected transistors and to said input pad, said network biasing said transistors, in a first mode, ON and in a second mode, OFF based on whether said input voltage exceeds said predetermined maximum process voltage, respectively.

14. An ESD protection network according to claim 13, wherein said bias network keeps said serially connected transistors OFF and at voltage levels not greater than said predetermined maximum process voltage while said IC is operating normally.

15. An ESD protection network according to claim 13, further comprising a transient detector coupling to said bias network, said transient detector activating said bias network when detecting a transient caused by said input voltage exceeding said predetermined maximum process voltage.

16. An ESD protection network according to claim 13, wherein said two serially connected transistors are p-channel field-effect transistors.

17. An ESD protection network according to claim 13, wherein said two serially connected transistors are n-channel field-effect transistors.

18. A circuit according to claim 13, said two serially connected transistors further operating/third model by turning ON said two transistors when said bus experiences a voltage exceeding a second predetermined voltage from said input.

19. A network according to claim 13, wherein said transient clamp is constructed with bipolar devices.

20. A network according to claim 13, wherein said transient clamp is constructed with MOSFET devices.

* * * * *